United States Patent [19]

Inoue

[11] Patent Number: 5,478,764
[45] Date of Patent: Dec. 26, 1995

[54] METHOD OF PRODUCING SEMICONDUCTOR DEVICE INCLUDING SCHOTTKY BARRIER DIODE INCORPORATING A CVD REFRACTORY METAL LAYER

[75] Inventor: Kenichi Inoue, Kawasaki, Japan

[73] Assignee: Fujitsu Limited, Kawasaki, Japan

[21] Appl. No.: 240,392

[22] Filed: May 10, 1994

Related U.S. Application Data

[63] Continuation of Ser. No. 22,400, Feb. 24, 1993, abandoned, which is a continuation of Ser. No. 747,983, Aug. 21, 1991, abandoned.

[30] Foreign Application Priority Data

Aug. 23, 1990 [JP] Japan ................... 2-219922

[51] Int. Cl.$^6$ ............................... H01L 21/265
[52] U.S. Cl. ............... 437/39; 437/175; 437/200; 148/DIG. 139; 148/DIG. 140; 257/471; 257/474; 257/483; 257/484
[58] Field of Search ............... 437/39, 175, 200; 148/DIG. 139, DIG. 140; 257/471, 474, 483, 484

[56] References Cited

U.S. PATENT DOCUMENTS

| | | |
|---|---|---|
| 4,254,428 | 3/1981 | Feth et al. . |
| 4,379,832 | 4/1983 | Dalal et al. ................... 437/175 |
| 4,619,035 | 10/1986 | Holta et al. ................... 437/39 |
| 4,638,400 | 1/1987 | Brown et al. ................... 437/195 |
| 4,724,223 | 2/1988 | Ditchek . |
| 4,862,244 | 8/1989 | Yamagishi ................... 257/484 |
| 4,985,372 | 1/1991 | Narita ................... 437/192 |

FOREIGN PATENT DOCUMENTS

| | | |
|---|---|---|
| 0021220 | 6/1980 | European Pat. Off. . |
| 0057135 | 8/1982 | European Pat. Off. . |
| 3617922 | 12/1986 | Germany . |
| 63-193571 | 8/1988 | Japan . |
| 64-71177 | 3/1989 | Japan . |
| 0148832 | 6/1991 | Japan ................... 437/175 |

OTHER PUBLICATIONS

N. G. Anantha et al., "A Schottky Barrier Diode with Very Narrow Self–Aligned Guard Ring," *Extended Abstracts*, vol. 82–2, Oct. 1982, Princeton, N.J., pp. 270–271.
Ghandhi, "VLSI Fabrication Principles" Sarah K. Ghandi, pp. 437–439, 1983.

*Primary Examiner*—Olik Chaudhuri
*Assistant Examiner*—Long Pham
*Attorney, Agent, or Firm*—Staas & Halsey

[57] ABSTRACT

A method of producing a semiconductor device including a Schottky barrier diode (SBD) comprising the steps of: selectively forming an insulating layer having a first contact hole and a second contact hole, on a (100) silicon semiconductor substrate; selectively forming a polysilicon layer extending from the first contact hole to the second contact hole, the polysilicon layer having a viahole within the first contact hole for selectively exposing the silicon semiconductor substrate; and selectively depositing a refractory metal (tungsten or molybdenum) layer on the polysilicon layer and an exposed portion of the substrate within the viahole by a selective CVD process, so that the SBD is formed between the exposed portion and the metal layer. The refractory metal layer is formed on the silicon of the exposed portion of the substrate and the polysilicon layer and is not formed on the insulating layer, and thus it is unnecessary to perform a photolithography process for patterning the refractory metal layer.

7 Claims, 7 Drawing Sheets

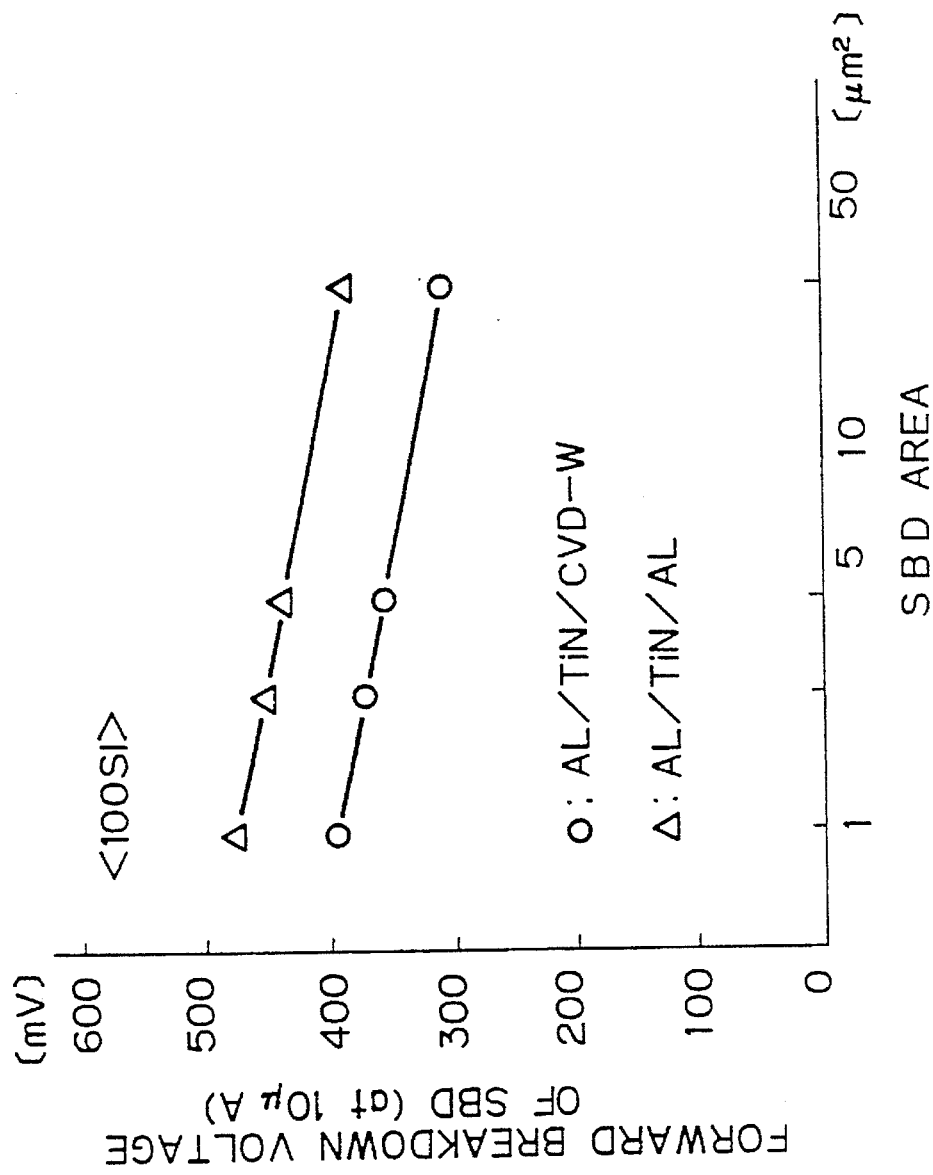

METHOD OF PRODUCING SEMICONDUCTOR DEVICE INCLUDING SCHOTTKY BARRIER DIODE INCORPORATING A CVD REFRACTORY METAL LAYER

This application is a continuation of application Ser. No. 08/022,400, filed on Feb. 24, 1993, now abandoned, which is a continuation of application Ser. No. 07/747,983, filed Aug. 21, 1991, now abandoned.

BACKGROUND OF THE INVENTION

1. Field of the Invention

The present invention relates to a semiconductor device, and more particularly, to a method of producing a semiconductor device comprising a Schottky barrier diode (SBD).

2. Description of the Related Art

An increase in the number of elements per semiconductor chip and miniaturization of semiconductor devices are now required, and thus it is necessary to reduce the areas (dimensions) of an SBD and an electrode of a semiconductor device.

In a conventional process of producing a semiconductor device shown in, e.g., FIG. 1, a metal electrode for forming an SBD and extending to a transistor is made of aluminum or an alloy thereof (Al-Si, Al-Cu, Al-Si-Cu or the like), indicated as "Al" hereinafter. In this case, the semiconductor device is produced in the following manner.

As shown in FIG. 1, a silicon semiconductor substrate 1 comprises a P-type silicon wafer 2, an $N^+$-type buried layer 3, and an N-type epitaxial silicon layer 4. The silicon wafer 2 usually has a <111> orientation, and the silicon substrate 1 is selectively and thermally oxidized to form a $SiO_2$ insulating layer 5 thereon. Regions of the substrate 1 corresponding to the SBD and doped regions of a bipolar transistor are not oxidized, and a trench isolation region 6 reaching the silicon wafer 1 is formed in a conventional process. The trench isolation region 6 comprises a $SiO_2$ insulating layer 7 coating a trench wall, a filler 8 of, e.g., polysilicon, and a cap $SiO_2$ insulating layer 9. Then, polysilicon is deposited on the whole surface by a chemical vapor deposition (CVD) method to form a polysilicon layer, and the layer is patterned by a photolithography technique to form polysilicon layers 11A, 11B and 11C, which become a portion of an SBD electrode, a portion of an electrode for the doped region, and a portion of an interconnection (a wiring), respectively. Thus, the polysilicon layer 11A has a through hole corresponding to the SBD region. The polysilicon layers 11A and 11C are doped with acceptor (p-type) impurities by an ion implantation process, and the polysilicon layer 11B is doped with donor (n-type) impurities by an ion implantation process. The doped impurities are then diffused into the substrate 1 (i.e., the epitaxial silicon layer 4) by a thermal diffusion process to form a P-type guard ring 12 and an $N^+$-type region 13 (e.g., a collector region), respectively. An insulating material (e.g., $SiO_2$) is deposited on the whole surface by a CVD process, to form an insulating layer 14, and the layer 14 is patterned by a photolithography technique to form openings for contact regions. Al (or Al alloy) is then deposited on the whole surface by a sputtering process (or a vapor deposition process) and so as to come into contact with an exposed surface of the substrate 4 in the region of the SBD through the window in the polysilicon layer 11A, and the polysilicon layers 11A, 11B and 11C. Thus, a Schottky barrier diode is formed at the interface between the Al and the silicon indicated as "SBD" in FIG. 1. The deposited Al layer is patterned by a photolithography technique to form Al wirings (i.e., a conductor line 15A including an electrode of the SBD and interconnecting the SBD and the doped region, and another conductor line 15B). Thereafter, another insulating material (e.g., $SiO_2$) is deposited on the whole surface to form a passivation insulating layer 16, and the layer 16 is selectively etched to form a contact hole, and then a metal (Al or Al alloy) or a combination of a barrier thin metal (TiN, TiW or the like) and Al (or Al alloy) is deposited on the whole surface and is patterned by a photolithography technique to form a predetermined metal wiring (conductor line) 17, whereby a semiconductor device with the SBD is obtained.

Where the SBD is formed by using Al (or Al alloy), the properties of the SBD depend upon the orientation (<100> or <111>) of the silicon single crystalline substrate (wafer). The use of a (100) oriented silicon substrate makes the SBD area layer greater than that in a (111) oriented silicon substrate, and the SBD level does not match a demanded level of a device property, and thus the (111) oriented silicon substrate is widely used.

For miniaturization of the semiconductor device, there is a need to reduce the area (dimensions) of the SBD, and as it is preferable to use a silicon substrate (wafer) having less crystal defects, preferably the (100) oriented silicon substrate is adopted.

Furthermore, the use of the Al wiring (the conductor lines 15A and 15B) requires a photomask alignment step and an etching step in the photolithography technique, with the result that it is necessary to take into account an alignment deviation and an etching shift, which prevent the required miniaturization.

SUMMARY OF THE INVENTION

An object of the present invention is to provide an improved method of producing a semiconductor device including an SBD, which method contributes to miniaturization of the device.

Another object of the present invention is to provide a semiconductor device including an SBD which is smaller than a conventional SBD.

The above-mentioned objects and other objects of the present invention are attained by providing a method of producing a semiconductor device including a Schottky barrier diode (SBD) comprising the steps of: selectively forming an insulating layer on a silicon semiconductor substrate, the insulating layer having a first contact hole and a second contact hole for exposing the silicon semiconductor substrate; selectively forming a polysilicon layer extending from the first contact hole to the second contact hole and into each thereof, the polysilicon layer portion formed within the first contact hole further having an opening therein for selectively exposing the silicon semiconductor substrate; and selectively depositing a refractory metal layer on the polysilicon layer and through the opening therein onto the thereby exposed portion of the substrate within the opening by a selective CVD process, so that a Schottky barrier diode is formed between the exposed portion of the substrate within the opening in the polysilicon layer and the refractory metal layer.

After the refractory metal layer deposition step, the method further comprises the steps of forming a second insulating layer on the whole surface having a third contact hole; and forming a conductor layer on the second insulating layer and so as to come into contact with the refractory metal layer.

Preferably, the refractory metal layer is made of tungsten or molybdenum; when the refractory metal layer is formed on the silicon of the exposed portion of the substrate and the polysilicon layer and is not formed on the insulating layer at the deposition step, it is unnecessary to perform a photolithography process for patterning the refractory metal layer. Also, preferably, the substrate is a (100) oriented silicon substrate (wafer); when the SBD is formed by depositing the refractory metal on the (100) silicon substrate by a CVD process, a refractory metal compound (e.g., $WF_6$) is reacted with silicon of the substrate and the refractory metal elements penetrate the silicon, with the result that the refractory metal layer interface with the (111) plane of the silicon causes the Schottky barrier height to be lower than the (100) plane. Therefore, although the (100) oriented silicon substrate is used, the SBD is substantially formed on the (111) plane, so that the area (dimensions) of the SBD depends upon the (111) oriented silicon.

The polysilicon layer formation step comprises the steps of: depositing the polysilicon layer over the whole surface, and selectively etching the polysilicon layer in accordance with a predetermined pattern, so that the polysilicon layer in the first contact hole does not coat the center part of the hole corresponding to an SBD area, and thus the portion of the silicon substrate for the SBD is exposed in the first contact hole.

After patterning of the polysilicon layer (prior to the refractory metal layer deposition step), impurities are doped into the polysilicon layer and are thermally diffused therefrom into the substrate, to form a guard ring for the SBD at the first contact hole and a doped region (e.g., a collector region of a bipolar transistor) at the second contact hole.

According to the production method of the present invention, it is possible to produce a semiconductor device including a Schottky barrier diode comprising: a (100) silicon semiconductor substrate; an insulating layer formed on the substrate and having a first contact hole and a second contact hole; a polysilicon layer extending on the insulating layer from the first contact hole to the second contact hole, into each thereof and covering the second contact hole but having a viahole (i.e., an opening) in the portion therein within the first contact hole and selectively exposing therethrough the corresponding first surface portion of the substrate; and a refractory metal layer, deposited on the polysilicon layer and the portion of the substrate exposed selectively through the viahole (i.e., opening) in the polysilicon layer within the first contact hole by a selective CVD process, forming a Schottky barrier diode between the refractory metal layer and the thus-exposed portion of the substrate within the first contact hole.

BRIEF DESCRIPTION OF THE DRAWINGS

The present invention will be more apparent from the description of the preferred embodiments set forth below, with reference to the accompanying drawings, in which:

FIG. 5 is a graph showing a relationship between a forward breakdown voltage of the SBD and the area of the SBD.

DESCRIPTION OF THE PREFERRED EMBODIMENTS

Example 1

Figure 1:
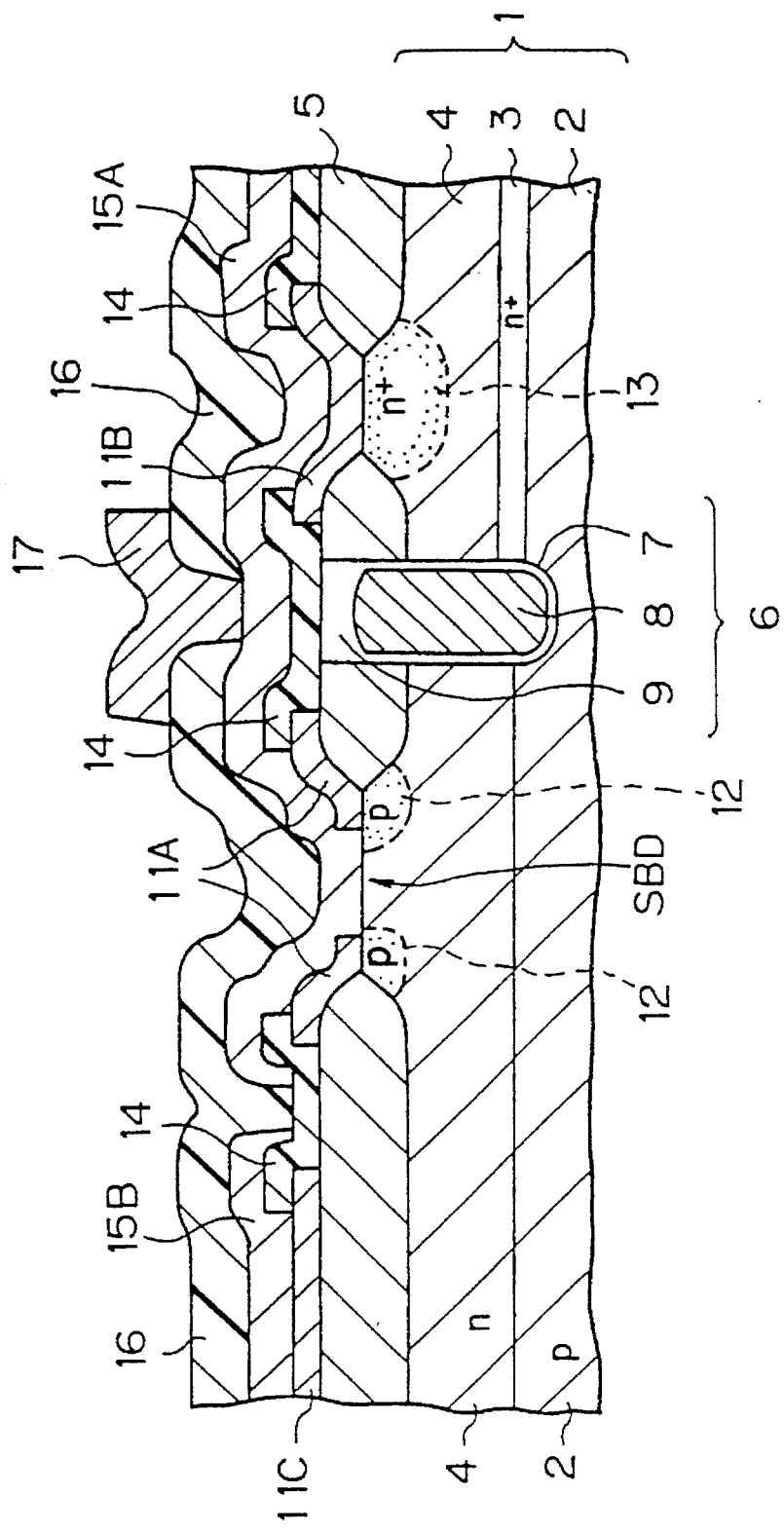
FIG. 1 is a schematic sectional view of a conventional semiconductor device including an SBD.
Figure 2A:
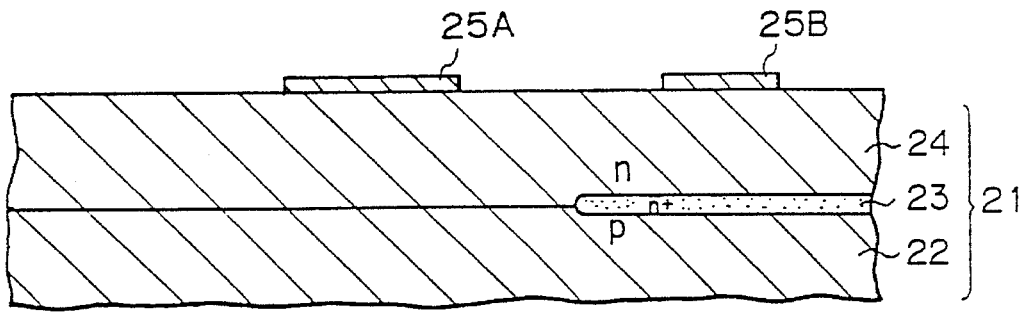
FIGS. 2A to 2H are schematic sectional views of a semiconductor device including an SBD in various stages of production in accordance with a first embodiment of the present invention.
Figure 2B:
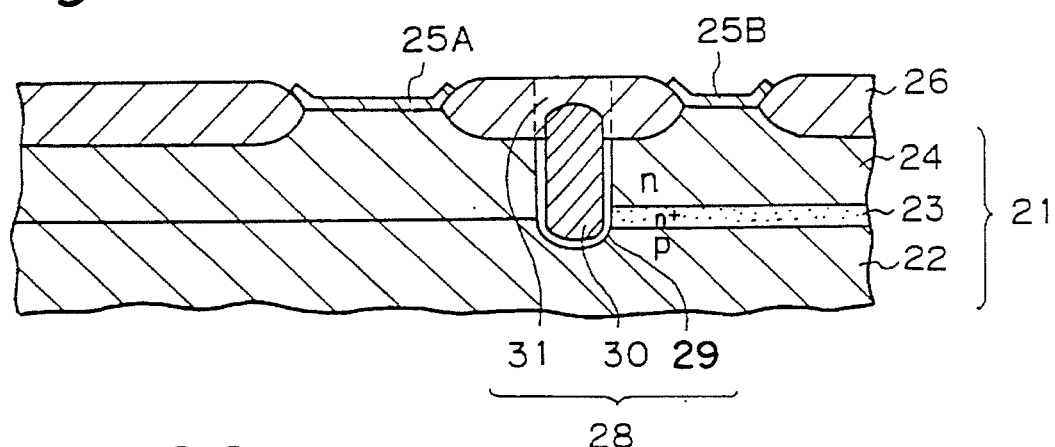
Figure 2C:
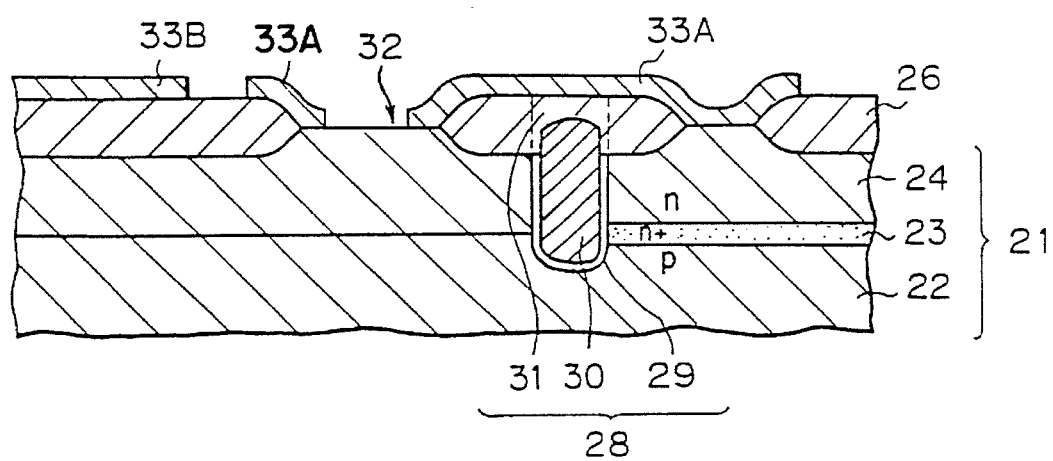

Referring to FIGS. 2A to 2H, a semiconductor device including an SBD is produced in accordance with the first embodiment of the present invention as follows. Note that the production steps shown in FIGS. 2A to 2E are similar to those of a conventional semiconductor device. Although the order (sequence) of the steps shown in FIGS. 2A to 2E is similar to conventional production steps, the pattern of a polysilicon layer shown in FIG. 2C is defined in accordance with the present invention.

As shown in FIG. 2A, an N-type (100) oriented silicon substrate 21 comprises a P-type (100) oriented silicon wafer 22, an $N^+$-type buried layer 23, and an N-type epitaxial silicon layer 24. In this case, the wafer 21 is selectively doped with donor (n-type) impurities to form the buried layer 23, and the N-type silicon layer 24 is then epitaxially grown on the substrate 21, so that the layer 23 has the same orientation as the wafer 22. A silicon nitride ($Si_3N_4$) layer is deposited on the whole surface of the substrate 21 by a CVD process, and is patterned by a photolithography process to form silicon nitride layers 25A and 25B at predetermined locations. Such a photolithography process comprises the steps of coating a resist layer, exposing the layer through a photomask (or by a electron beam), developing same to leave a resist mask, and etching the silicon nitride layer not covered by the resist mask.

Next, as shown in FIG. 2B, the silicon substrate 21 is subjected to a thermal oxidation treatment, to oxidize a portion of the silicon epitaxial layer 24 not covered by the silicon nitride layers 25A and 25B, and as a result, a $SiO_2$ (insulating) layer 26 is formed on the substrate 21. The portions of the silicon epitaxial layer 24 covered with the silicon nitride layers 25A and 25B are not oxidized and correspond to an SBD region and a doped region of a transistor (e.g., a collector region of a bipolar transistor). A trench isolation region 28 reaching the silicon wafer 22 is formed in accordance with a conventional process, and comprises a $SiO_2$ insulating layer 29 coating a trench wall, a filler 30 of, e.g., polysilicon, and a cap $SiO_2$ insulating layer 31. The $SiO_2$ layer 26 and the silicon substrate 21 are selectively and anisotropically etched to form a trench. The inside wall of the silicon substrate 21 in the trench is thermally oxidized to form $SiO_2$ insulating thin layer 29. The polysilicon is deposited in the trench. Then an upper portion of the filled polysilicon 30 is thermally oxidized to form the cap $SiO_2$ insulating layer 31, which is combined with the $SiO_2$ layer 26.

The silicon nitride layers 25A and 25B are removed by a suitable etchant to form a first contact hole at a location of the layer 25A and a second contact hole at a location of the layer 25B, in which holes portions of the silicon substrate 21 are exposed. Then, as shown in FIG. 2C, polysilicon is deposited on the whole surface by a CVD process and is patterned by a photolithography process to form polysilicon layers 33A and 33B having a predetermined pattern and a thickness of, e.g., 300 nm. The polysilicon layer 33A extends from the first contact hole to the second contact hole and into each thereof and thereby comes into contact with the corresponding exposed portions of the silicon substrate 21. The polysilicon layer 33A fully covers the second contact hole and partially covers the first contact hole, i.e., a center part thereof is not covered. Namely, a viahole 32 for an electrode of an SBD is formed in the polysilicon layer 33A. The polysilicon layer 33B serves as a wiring (interconnection).

Figure 2D:
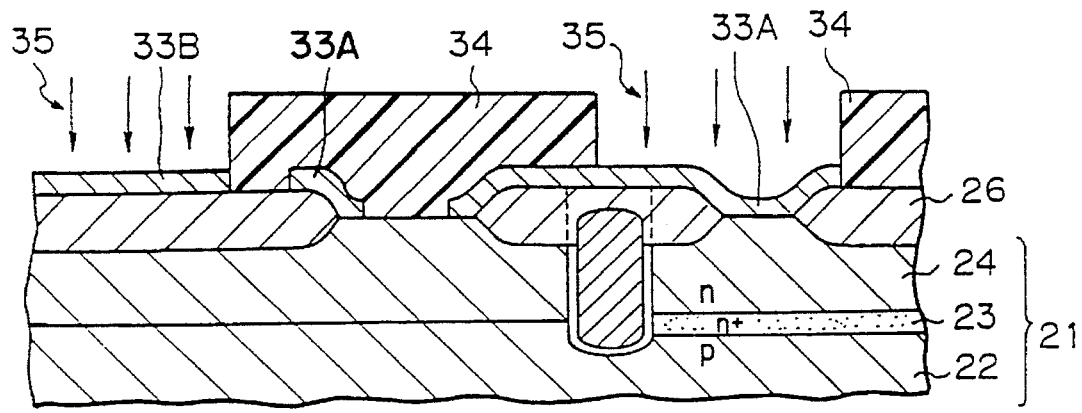

As shown in FIG. 2D, a resist mask 34 is formed to expose the polysilicon layer 33B and a predetermined portion of the polysilicon layer 33A by coating a resist layer on the whole surface, exposing same through a photomask (not shown), and then developing same. Then, the exposed polysilicon layers are doped with donor (n-type) impurities 35 (e.g., P, As) by an ion implantation process.

Figure 2E:
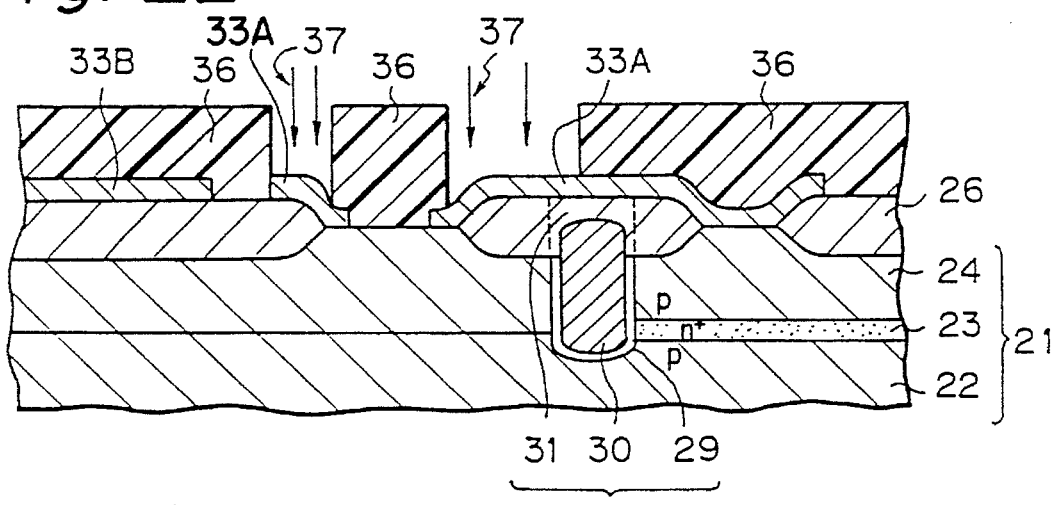

After the removal of the resist mask 34, as shown in FIG. 2E, another resist mask 36 is formed to expose other predetermined portions of the polysilicon layer 33A by coating a resist layer on the whole surface, exposing same through another photomask (not shown), and developing same. Then, the exposed polysilicon layer 33A is doped with acceptor (p-type) impurities 37 (e.g., B) by an ion implantation process.

Figure 2F:
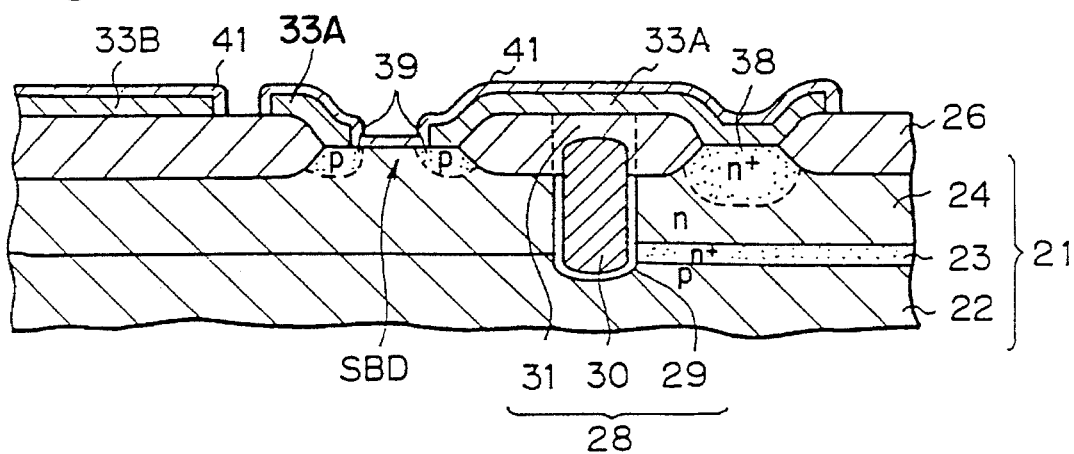

After removal of the resist mask 36, as shown in FIG. 2F, the impurities contained in the polysilicon layer 33A are diffused into the epitaxial silicon layer 24 by a heat-treatment, with the result that an $N^+$-type region 38 (a collector region) and a P-type region 39 (i.e., guard ring) for the SBD are formed. The P-type guard ring 39 exists around the periphery of the SBD, to raise the reverse breakdown voltage thereof. This happens because the guard ring reduces the electric field at sharp corners of the SBD.

After a conventional cleaning step is performed, in accordance with the present invention, tungsten (W) is deposited on the polysilicon layers 33A and 33B and the exposed surface of the epitaxial silicon layer 24 by a selective CVD process, to form a tungsten layer 41 having a thickness of, e.g., 100 nm, as shown in FIG. 2F. In the CVD process, a $WF_6$ gas, a $SiH_4$ gas and a $H_2$ gas are used and the silicon substrate 21 is heated at 300° C. with an infrared ray lamp arranged under the substrate 21, so that tungsten is deposited on the silicon only, by utilizing a reducing reaction. The tungsten layer comes into contact with the exposed silicon surface of the substrate 21 to form the Schottky barrier diode (SBD).

Figure 2G:
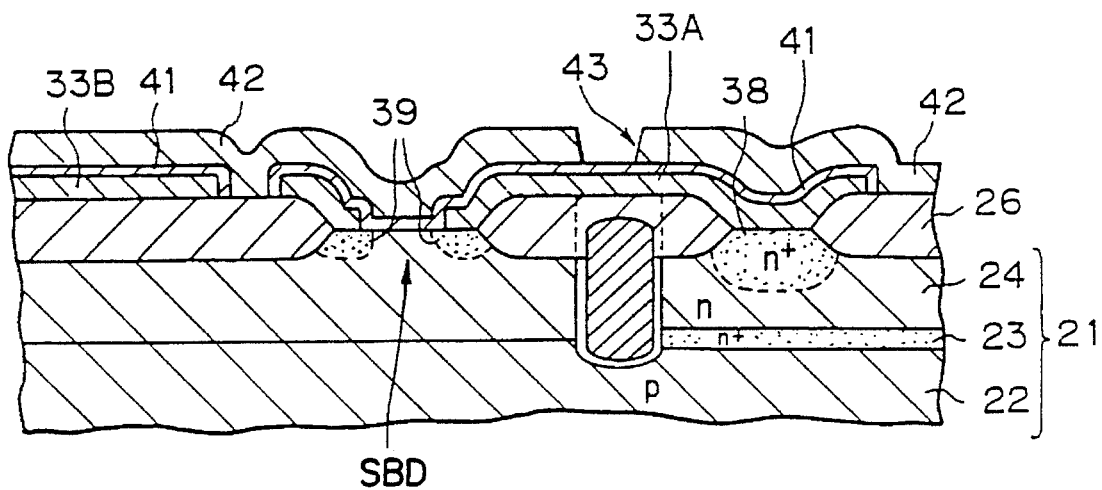

Then, as shown in FIG. 2G, an insulating material (e.g., $SiO_2$, PSG) is deposited on the whole surface by a CVD process, to form an insulating layer 42. The layer 42 is selectively etched in accordance with a photolithography process to form (open) a contact hole 43 in which a portion of the tungsten layer 41 is exposed.

Figure 2H:
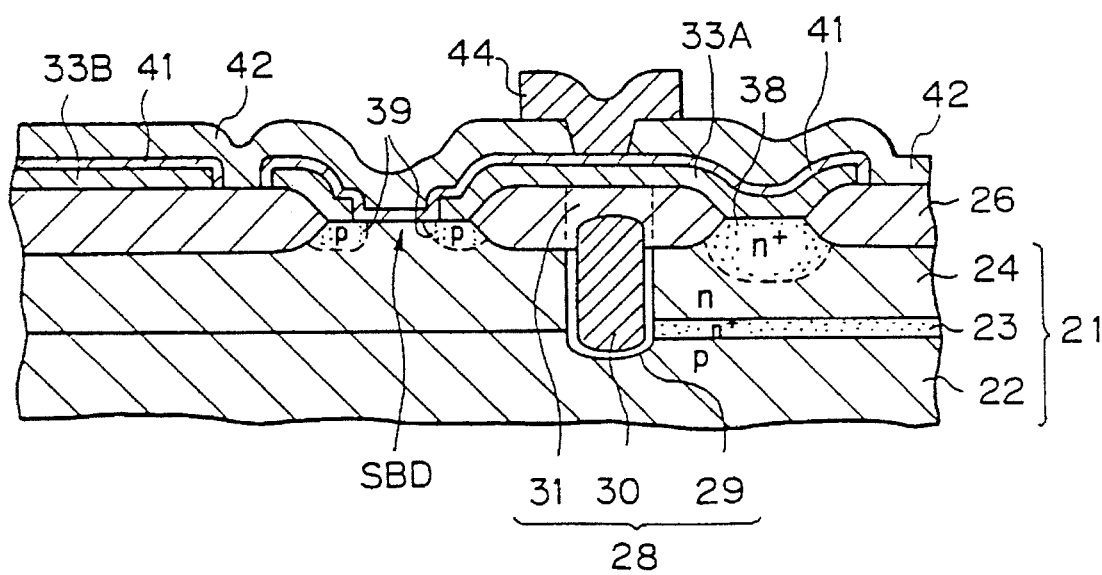

Next, as shown in FIG. 2H, a conductor (metal) material (e.g., Al) is deposited on the whole surface by a vacuum vapor deposition process or a sputtering process to form a conductor layer, and the conductor layer is patterned by a photolithography process to form a conductor line (interconnection) 44. It is possible to form the conductor layer of a combination of a barrier metal layer (TiN, TiW and the like) and an Al layer thereon. The conductor line 44 comes into contact with the tungsten layer 41 through the contact hole 43. Thus, the semiconductor device including an SBD is obtained.

Example 2

Figure 3A:
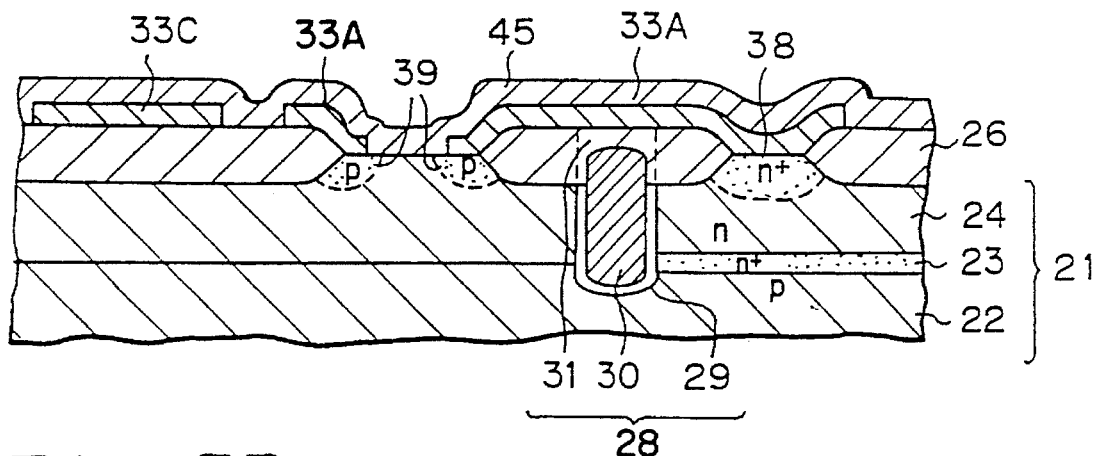
FIGS. 3A to 3C are schematic sectional views of a semiconductor device including an SBD in various stages of production in accordance with a second embodiment of the present invention.
Figure 3B:
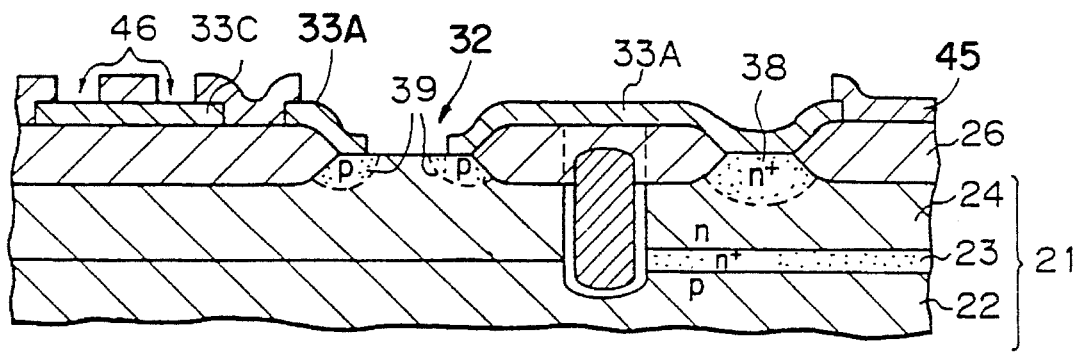
Figure 3C:
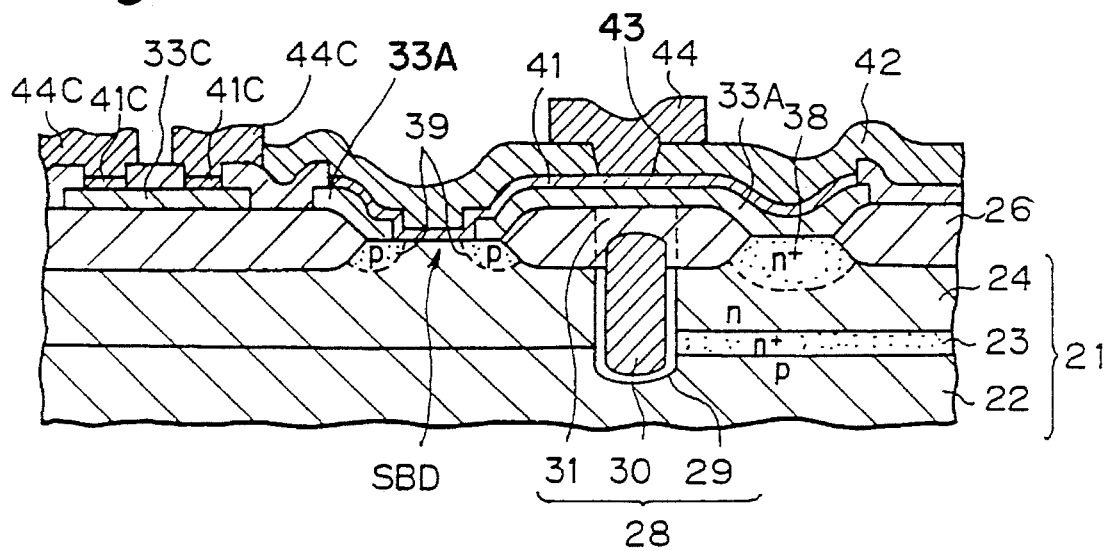

Referring to FIGS. 3A to 3C, a semiconductor device including an SBD and a polysilicon resistor is produced in accordance with the second embodiment of the present invention as follows. Note that the semiconductor device except the polysilicon resistor is produced in the same manner as Example 1, and a conductor line consisting of the polysilicon layer 33B and the tungsten layer 41 coated thereon in Example 1 is changed to the polysilicon resistor of Example 2.

While the polysilicon layers 33A and 33B (FIG. 2C) are formed in Example 1, in the present Example 2, a polysilicon resistor layer 33C is formed instead of the layer 33B, as shown in FIG. 3A. Then, an insulating material (e.g., $SiO_2$, PSG) is deposited on the whole surface by a CVD process to form an insulating layer 45 having a thickness of, e.g., 300 nm.

As shown in FIG. 3B, the insulating layer 45 is selectively etched by a photolithography process to expose a portion of the silicon substrate 21 (i.e., as selectively exposed through the viahole (i.e., opening) 32) for forming an SBD therein and the polysilicon layer 33A except for an end portion thereof and to open contact holes 46 for electrodes of the polysilicon resistor. Opposite end portions of the polysilicon layer 33C are exposed in the respective, spaced contact holes 46.

As shown in FIG. 3C, tungsten (W) is deposited on the exposed surface of the silicon substrate 21, the polysilicon layer 33A and the exposed portions of the polysilicon layer 33C by the selective CVD process explained in Example 1 (cf. FIG. 2F), to form the tungsten layer 41 and tungsten filling layers 41C having a thickness of, e.g., 100 nm, and as a result, the SBD is formed between the tungsten layer 41 and the silicon substrate 21. Then, an insulating material is deposited over the whole surface to form the insulating layer 42, in the same manner as that shown in FIG. 2G. The insulating layer 42 is selectively etched to form contact holes for the tungsten layer 41 and a window (hole) covering the resistor. Then, a conductor (metal) material (e.g., Al) is deposited on the whole surface to form a conductor layer, and the conductor layer is patterned by a photolithography process to form a conductor line (interconnection) 44 and electrodes (conductor lines) 44C. The conductor line 44 comes into contact with the tungsten layer 41 through the contact hole 43, and the electrodes 44C come into contact with the tungsten filling layers 41C through the contact holes 46. The tungsten filling layers 41C in the contact holes 46 reduce the contact resistance and improve the step coverage. Thus, the semiconductor device including an SBD is obtained.

The above-mentioned Examples 1 and 2 explain the production process of the semiconductor device including the SBD. Next, the properties of SBDs formed in a silicon single crystalline substrate (wafer) are explained with reference to FIGS. 4 and 5.

Figure 4:
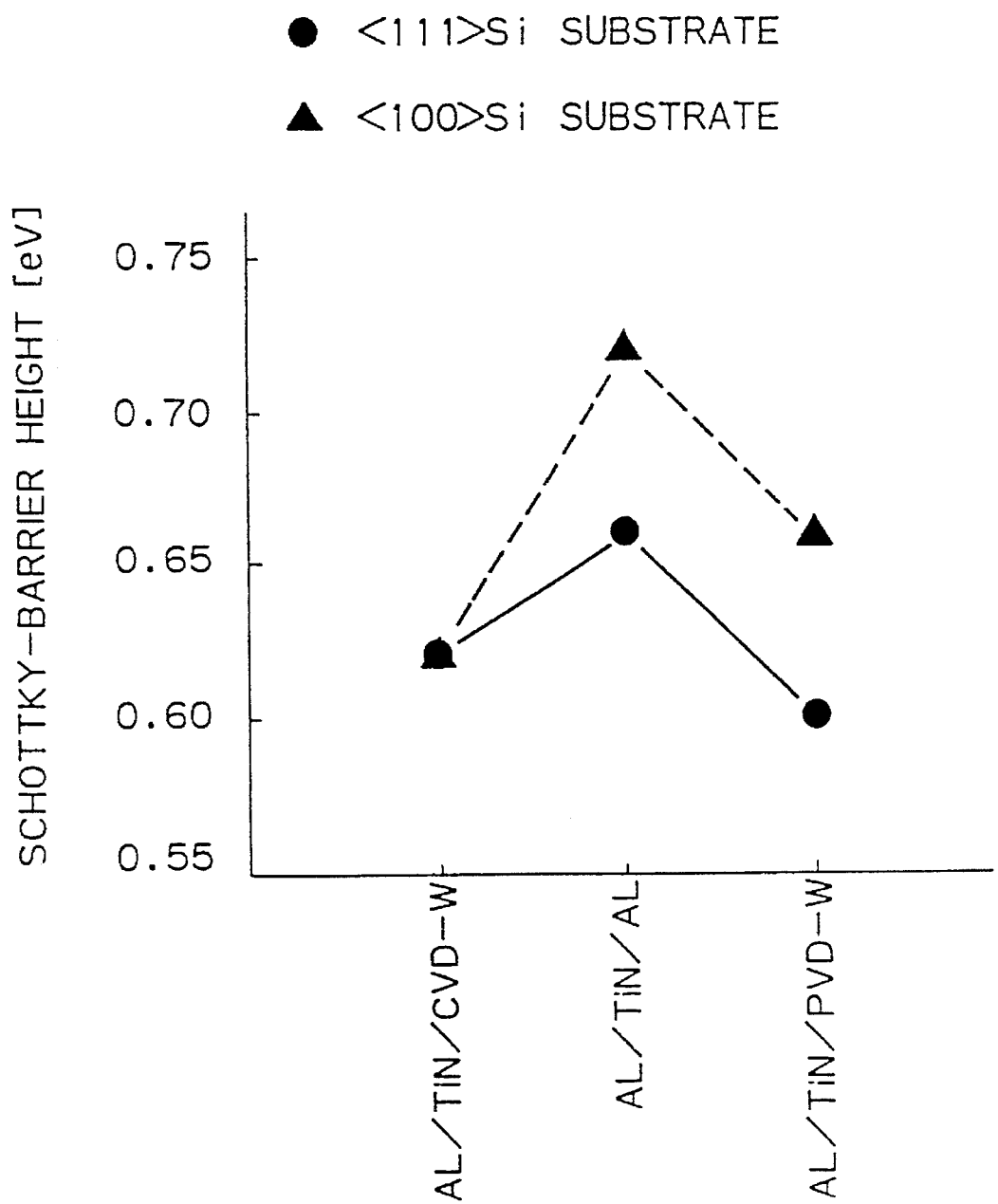
FIG. 4 is a graph showing a relationship between a Schottky barrier height and a layer construction of an SBD electrode.

In FIGS. 4 and 5, "Al/TiN/CVD-W" corresponding to a method of the present invention means that a tungsten layer is formed on the silicon substrate by the selective CVD process, a TiN (barrier metal) layer is formed on the tungsten layer and an aluminum layer is formed on the TiN layer, with the result that an SBD electrode is formed. "Al/TiN/Al" corresponding to a conventional method means that an aluminum layer, a TiN layer and another aluminum layer are successively formed on the silicon substrate, to form an SBD electrode. "Al/TiN/PVD-W" corresponding to a comparative method means that a tungsten layer is formed on the silicon substrate by a sputtering process, i.e., a physical vapor deposition (PVD) process, instead of the selective CVD process used in the "Al/TiN/CVD-W" case.

Schottky barrier heights (eV) of the SBDs were detected, depending on structural differences of the SBD electrodes and different orientations of the silicon substrates, and the obtained data is shown in FIG. 4. As can be seen from FIG. 4, the barrier height of the SBD with the electrode comprising the CVD-W layer does not depend on the substrate orientation. Namely, the barrier height at the "Al/TiN/CVD-W" is not varied, although a (111) silicon substrate and a (100) silicon substrate are used.

FIG. 5 shows a relationship between the forward breakdown voltage (at 10 µA) of the SBD and the area of the SBD formed by using the (100) silicon substrate. For example, properties of 10 µA and 400 mV of the SBD are attained for the electrode of "Al/TiN/CVD-W" having a 1 µm$^2$ area, but are attained for the electrode of "Al/Tin/Al" having a 25 µm$^2$ area. Thus, when the "Al/TiN/CVD-W" electrode is adopted, the required SBD properties can be attained by a smaller electrode area than in a conventional case. Therefore, when a semiconductor device including an SBD is produced in accordance with the method of the present invention, the (100) silicon substrate can be used and the area of the SBD is smaller than that of a conventional SBD with an Al electrode.

As mentioned above, according to the present invention, a refractory metal for forming an SBD is formed in a predetermined pattern by a selective CVD process, without using a photolithography process including an etching step, and thus is it not necessary to take into account a requisite gap and tolerance for the photolithography technique. The refractory metal improves the conductivity of a conductor line comprising a polysilicon layer, to further contribute to a reduction of the required dimensions of the conductor line. Furthermore, the use of the refractory metal layer formed by the selective CVD method enables a reduction of the SBD area and permits the use of the (100) silicon substrate.

The (100) silicon substrate has less crystalline defects than the (111) silicon substrate, and thus the properties of a semiconductor device of the (100) silicon substrate are superior to those of the (111) silicon substrate device. Therefore, the present invention contributes to the miniaturization of and an increase of the degree of integration of the semiconductor device, particularly a bipolar transistor type RAM device.

In addition to the above-mentioned embodiments for connecting the SBD and the collector of the bipolar transistor, the present invention can be employed to form a connection between SBDs in a RAM device.

It will be obvious that the present invention is not restricted to the above-mentioned embodiments and that many variations are possible for persons skilled in the art without departing from the scope of the invention.

I claim:

1. A method of producing a semiconductor device, including a Schottky barrier diode, comprising the steps of:

selectively forming an insulating layer on a silicon semiconductor substrate, said insulating layer having a first contact hole and a second contact hole respectively exposing therethrough corresponding first and second surface portions of said silicon semiconductor substrate;

selectively forming a polysilicon layer extending along said insulating layer from said first contact hole to said second contact hole and including first and second polysilicon layer portions respectively extending through said first and second contact holes and contacting said corresponding first and second exposed surface portions of said substrate, said first polysilicon layer portion having a via hole therein, and thus within said first contact hole, through which said first surface portion of said substrate is selectively exposed, and the second polysilicon layer portion entirely covering the second contact hole and the second surface portion of said silicon semiconductor substrate; and selectively depositing, by a selective CVD process, a refractory metal layer on said polysilicon layer and on said first surface portion of said substrate selectively exposed through said viahole, thereby forming a Schottky barrier diode between said selectively exposed first surface portion of said substrate and said metal layer, the refractory metal layer extending continuously from the first contact hole and along the polysilicon layer to the second contact hole.

2. A method according to claim 1 further comprising, after the step of selectively depositing the refractory metal layer:

forming a second insulating layer on the entire surface of the substrate, said second insulation layer having a third contact hole therein through which a corresponding surface portion of the refractory metal layer is exposed; and forming a conductor layer on said second insulating layer, the conductor layer extending through the third contact hole and into contact with said corresponding exposed surface portion of said refractory metal layer.

3. A method according to claim 1, wherein said refractory metal layer is made of a metal selected from the group consisting of tungsten and molybdenum.

4. A method according to claim 1, wherein said refractory metal layer is made of tungsten.

5. A method according to claim 1, wherein said selectively exposed, first surface portion of said silicon semiconductor substrate is disposed in a central portion of said first contact hole.

6. A method according to claim 1 further comprising, prior to the step of selectively depositing the refractory metal layer:

doping impurities into said polysilicon layer in said first portion thereof, contiguous to and closely surrounding said first contact hole; and diffusing said impurities into said substrate by an annealing treatment to form a guard ring in said substrate in surrounding relationship relative to said Schottky barrier diode to be formed therein.

7. A method according to claim 1, wherein said silicon substrate has a (100) orientation.

* * * * *

UNITED STATES PATENT AND TRADEMARK OFFICE
CERTIFICATE OF CORRECTION

PATENT NO. : 5,478,764
DATED : Dec. 26, 1995
INVENTOR(S) : INOUE

It is certified that error appears in the above-indentified patent and that said Letters Patent is hereby corrected as shown below:

TITLE PAGE: [56] References Cited:

OTHER PUBLICATIONS, the second publication should read as follows:

> Ghandhi, Sorab K., "VLSI Fabrication Principles: Silicon and Gallium Arsenide," Chapter 8.1.5.3, pp. 437-439, John Wiley & Sons, NY, 1983.

Col. 1, line 9, change "07,747,983" to --07/747,983--.

Signed and Sealed this

Twenty-fifth Day of June, 1996

*Attest:*

BRUCE LEHMAN

*Attesting Officer*  *Commissioner of Patents and Trademarks*